United States Patent
Do (10) Patent No.: US 8,842,486 B2
(45) Date of Patent: Sep. 23, 2014

(54) INTEGRATED CIRCUIT CHIP AND SEMICONDUCTOR MEMORY DEVICE

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 246 days.

(21) Appl. No.: 13/329,688

(22) Filed: Dec. 19, 2011

(65) Prior Publication Data

US 2013/0094302 A1 Apr. 18, 2013

(30) Foreign Application Priority Data

Oct. 18, 2011 (KR) .................. 10-2011-0106580

(51) Int. Cl.
| | | |
|---|---|---|
| G11C 7/10 | (2006.01) |
| G11C 29/48 | (2006.01) |
| G11C 29/12 | (2006.01) |
| G11C 29/40 | (2006.01) |
| G11C 29/44 | (2006.01) |
| G11C 29/50 | (2006.01) |

(52) U.S. Cl.
CPC ............ *G11C 29/1201* (2013.01); *G11C 29/48* (2013.01); *G11C 2029/5002* (2013.01); *G11C 29/40* (2013.01); *G11C 29/44* (2013.01)
USPC ................. 365/201; 365/189.05; 365/200

(58) Field of Classification Search
USPC .................... 365/189.05, 200, 201
See application file for complete search history.

(56) References Cited

U.S. PATENT DOCUMENTS

| | | | | |
|---|---|---|---|---|
| 5,016,220 A * | 5/1991 | Yamagata | ............... | 365/201 |
| 5,778,028 A * | 7/1998 | Turner | ............... | 375/229 |
| 6,038,181 A * | 3/2000 | Braceras et al. | ............... | 365/201 |
| 2004/0213074 A1* | 10/2004 | Johnson et al. | ............... | 365/233 |

* cited by examiner

*Primary Examiner* — Hoai V Ho
*Assistant Examiner* — Jay Radke
(74) *Attorney, Agent, or Firm* — IP & T Group LLP (57) ABSTRACT

An integrated circuit chip includes an internal circuit configured to generate output data, an inversion determination unit configured to activate/deactivate an inversion signal according to state information regarding a state of the integrate circuit chip, and a signal output circuit configured to invert or not to invert the output data in response to the inversion signal and output the inverted or non-inverted output data.

14 Claims, 6 Drawing Sheets

INTEGRATED CIRCUIT CHIP AND SEMICONDUCTOR MEMORY DEVICE

CROSS-REFERENCE TO RELATED APPLICATIONS

The present application claims priority of Korean Patent Application No. 10-2011-0106580, filed on Oct. 18, 2011, which is incorporated herein by reference in its entirety.

BACKGROUND

1. Field

Exemplary embodiments of the present invention relate to an integrated circuit chip capable of recognizing the state of an integrated circuit chip and a semiconductor memory device capable of recognizing the state of a semiconductor memory device.

2. Description of the Related Art

As the integration degree of integrated circuit chips such as memory devices (DRAM and FLASH) increases, an amount of time and cost for testing an integrated circuit chip may increase. Conventionally, to recognize the state of an integrated circuit chip, such as internal temperature, internal voltage, or whether data is normally stored, a separate test pin to output information regarding the state of the integrated circuit chip has been added to the integrated circuit chip, or state information of the integrated circuit chip has been output through a data input/output pin.

When a separate test pin is added to test the integrated circuit chip, the test time and cost are increased by the addition of the test pin. Meanwhile, when the integrated circuit chip is tested by outputting the state information of the integrated circuit chip through a data input/output pin, data stored in a storage unit (for example, a memory cell of a DRAM) cannot be outputted through the data input/output pin while the state information of the chip is outputted through the data input/output pin. Therefore, since a data output test is to be additionally performed to recognize the stored data, the test time and cost may increase.

SUMMARY

An embodiment of the present invention is directed to an integrated circuit chip capable of recognizing the state of the integrated circuit chip without an additional test pin.

In accordance with an embodiment of the present invention, an integrated circuit chip includes: an internal circuit configured to generate output data; an inversion determination unit configured to activate/deactivate an inversion signal according to state information regarding a state of the integrate circuit chip; and a signal output circuit configured to invert or not to invert the output data in response to the inversion signal and output the inverted or non-inverted output data.

In accordance with another embodiment of the present invention, a semiconductor memory device includes: a cell array area; a plurality of data buses configured to transmit a plurality of data bits outputted from the cell array area; a parallel-serial conversion circuit configured to convert parallel data loaded in the plurality of data buses into serial data; an inversion determination unit configured to activate/deactivate an inversion signal according to state information regarding a state of the semiconductor memory device; and a data output circuit configured to invert the serial data outputted from the parallel-serial conversion circuit in response to the inversion signal and output the inverted data to a data pad.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
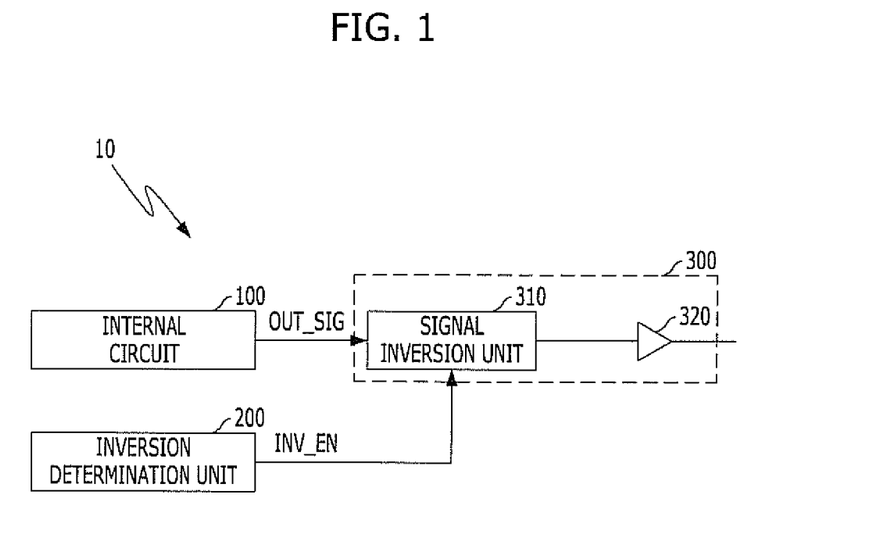
FIG. 1 illustrates an integrated circuit chip in accordance with an embodiment of the present invention.

FIG. 1 illustrates an integrated circuit chip in accordance with an embodiment of the present invention.

The integrated circuit chip 10 includes an internal circuit 100, an inversion determination unit 200, and a signal output circuit 300. FIG. 1 illustrates that one output data signal OUT_SIG is provided, but the present invention may also be applied to an integrated circuit chip that includes a plurality of output data signals OUT_SIG. Hereafter, one output data signal OUT_SIG is provided as an example, for illustration purposes.

The internal circuit 100 is configured to generate output data signal OUT_SIG. When the integrated circuit chip 10 is a CPU, the internal circuit 100 may include an operation circuit configured to perform various operations or a control circuit configured to analyze a command and generate a control signal. In the CPU example, the output data signal OUT_SIG may include data or a control signal outputted to a circuit outside of the CPU through a data bus. When the integrated circuit chip 10 is a semiconductor memory device, the internal circuit 100 may include a memory circuit configured to store inputted data and output the stored data. In the memory circuit example, the output data signal OUT_SIG may include data stored in a memory cell.

The inversion determination unit 200 is configured to activate or deactivate an inversion signal INV_EN according to state information of the integrated circuit chip 10. More specifically, when the integrated circuit chip 10 is tested, the inversion determination unit 200 deactivates the inversion signal INV_EN when the state of the integrated circuit chip 10 is normal, and activates the inversion signal INV_EN when the state of the integrated circuit chip 10 is abnormal. The state information of the integrated circuit chip may include internal temperature information of the integrated circuit chip, internal voltage information of the integrated circuit chip, and information indicating whether data is normally stored in a storage unit (not illustrated) in the integrated chip 10. More specifically, the state information indicates a specific state of the integrated circuit. For example, the state information may indicate the internal temperature information of the integrated circuit chip. In the internal temperature information example, when temperature information outputted from a temperature sensor deviates from a preset critical range, the inversion signal INV_EN may be activated, and when the temperature information falls within the critical range, the inversion signal INV_EN may be deactivated. For another example, the state information may include internal voltage information of the integrated circuit chip 10. Specifically, the state information may indicate a CPU internal operation voltage. In the internal operation voltage example, when the CPU internal operation voltage deviates from a preset critical range, the inversion signal INV_EN may be activated, and when the CPU internal operation voltage falls within the critical range, the inversion signal INV_EN may be deactivated. For another example, the state information may include information indicating whether data is normally stored in a storage unit (not illustrated) in the integrated circuit chip 10. Specifically, test data is stored in a plurality of storage units (not illustrated) in the integrated circuit chip 10, and data stored in the plurality of storage units is compared with the data stored in all of the storage units. Subsequently, when all of the stored data in the storage units is identical, the inversion determination unit 200 determines that the data is normally stored, and deactivates the inversion signal INV_EN. Alternatively, when the stored data is not identical in all storage units, the inversion determination unit 200 determines that a part of the data is not normally stored, and activates the inversion signal INV_EN.

Since the inversion determination unit 200 is used when testing the integrated circuit chip 10, the inversion determination unit 200 may be designed to deactivate the inversion signal INV_EN when the integrated circuit chip 10 is in a normal mode for performing a normal operation.

The signal output circuit 300 is configured to invert the output data signal OUT_SIG when the inversion signal INV_EN is activated, or configured not to invert the output data signal OUT_SIG when the inversion signal INV_EN is deactivated, and output the output data signal OUT_SIG. Specifically, the signal output circuit 300 may include a signal inversion unit 310 and a driver 320. The signal inversion unit 310 is configured to invert the output data signal OUT_SIG when the inversion signal INV_EN is activated, and configured not to invert the output data signal OUT_SIG when the inversion signal INV_EN is deactivated. The driver 320 outputs the output data signal outputted from the signal inversion unit 310.

For illustration purposes, FIG. 1 illustrates that one output data signal OUT_SIG is inputted to the signal output circuit 300. However, when a plurality of output data signal OUT_SIG are inputted, the signal output circuit 300 may be designed to invert or not to invert the plurality of output data signal OUT_SIG in response to the inversion signal INV_EN.

Figure 2:
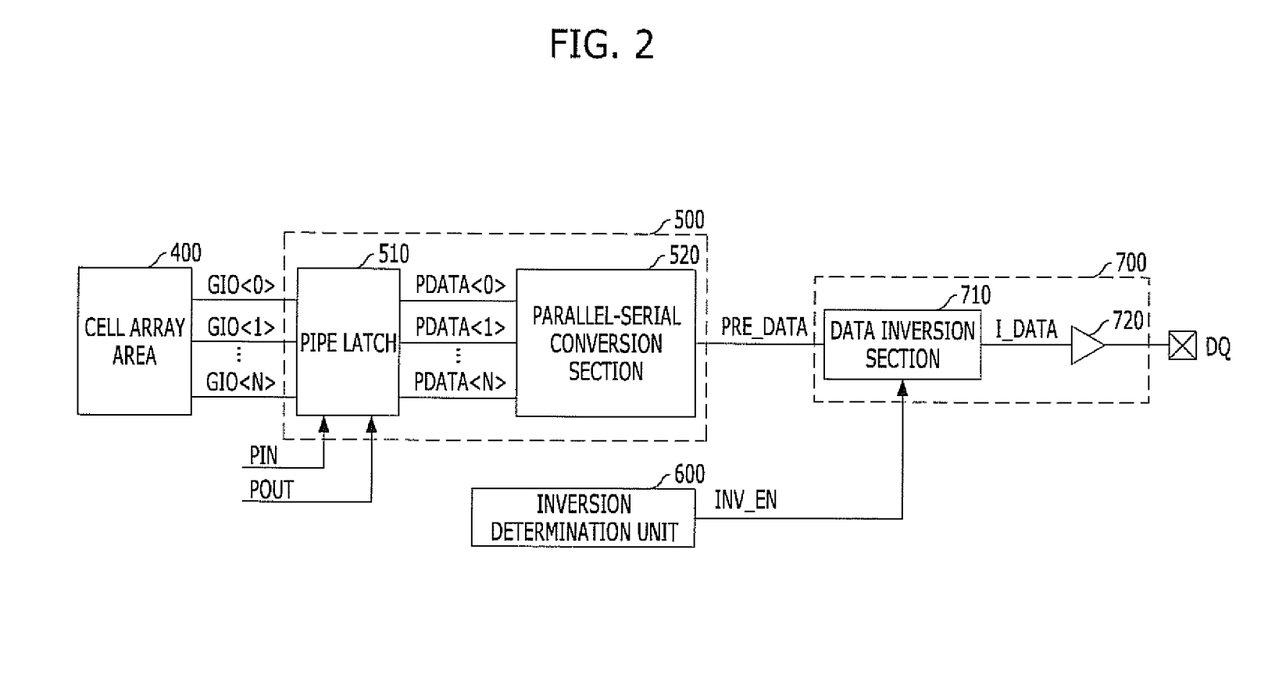
FIG. 2 illustrates a semiconductor memory device in accordance with a first embodiment of the present invention.

FIG. 2 illustrates a semiconductor memory device in accordance with a first embodiment of the present invention. FIG. 2 illustrates that one data pad DQ PAD is provided. However, the present invention may be also applied a semiconductor memory device including a plurality of data pads DQ PAD. Hereafter, one data pad DQ PAD is provided as an example, for illustration purposes.

The semiconductor memory device includes a cell array area 400, a plurality of data buses GIO<0:N>, a parallel-serial conversion circuit 500, an inversion determination unit 600, and a data output circuit 700.

The cell array area 400 includes a plurality of cells, and each cell stores data.

The plurality of data buses GIO<0:N> are configured to transmit a data outputted from the cell array area 400 to the parallel-serial conversion circuit 500. In this embodiment, data may be successively loaded into the plurality of data buses GIO<0:N>. When data is successively loaded into the plurality of data buses GIO<0:N>, the parallel-serial conversion circuit 500 may include a plurality of pipe latches 510. Hereafter, an example where one bit of data is loaded in the respective data buses GIO<0:N> will be taken as an example, for illustration purposes.

The parallel-serial conversion circuit 500 is configured to convert parallel data loaded in the plurality of data buses into serial data PRE_DATA. Specifically, the parallel-serial conversion circuit 500 may include a pipe latch 510 and a parallel-serial conversion unit 520. The pipe latch 510 is configured to receive and latch parallel data loaded in the plurality of data buses GIO<0:N> in synchronization with a first input control signal PIN. The pipe latch unit is also configured to output the latched data to the parallel-serial conversion unit 520 in synchronization with a first output control signal POUT.

The parallel-serial conversion unit 520 is configured to convert the parallel data PDATA<0:N> outputted from the pipe latch 510 into serial data and output the serial data PRE_DATA to a data inversion unit 710.

For example, data D0_0 is loaded in data bus GIO<0>, data D0_1 is loaded in data bus GIO<1>, and data D0_2 is loaded in data bus GIO<2>.

When a first input control signal PIN is activated, the data loaded in the respective data buses GIO<0:2> is latched in the pipe latch 510, and when a first output control signal POUT is activated, the latched parallel data PDATA<0:2> is outputted to the parallel-serial conversion unit 520. The parallel-serial conversion unit 520 sorts the parallel data PDATA<0:2> in series to generate the serial data PRE_DATA, and outputs the serial data PRE_DATA to the inversion unit 710.

Figure 3A:
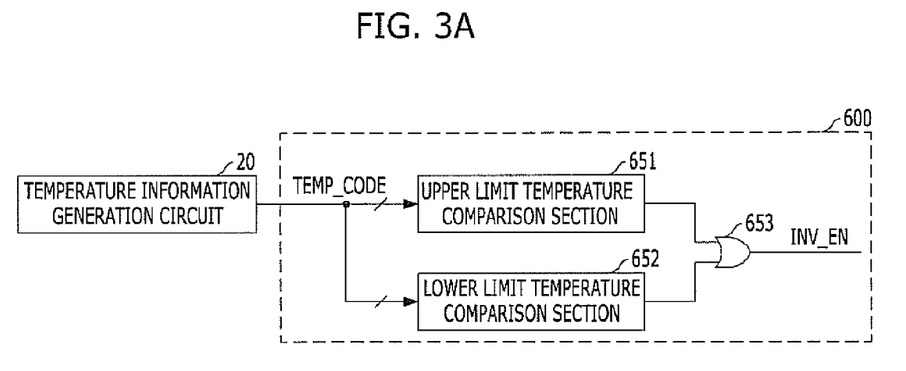
FIG. 3A illustrates a first example of an inversion determination unit of FIG. 2.

The inversion determination unit 600 is configured to activate or deactivate an inversion signal INV_EN according to the state information of the semiconductor memory device. Here, the state information includes temperature information of the semiconductor memory device, voltage information of the semiconductor memory device, or information indicating whether data is normally stored in the cell array area 400. More specifically, the state information indicates a specific state of the semiconductor memory device. Specifically, when the semiconductor memory device is tested, the inversion determination unit 600 deactivates the inversion signal INV_EN when the state information indicates that the characteristic (internal temperature, internal voltage, or whether data is normally inputted to the cell array area or not) of the semiconductor memory device is normal, and activates the inversion signal INV_EN when the state information indicates that the characteristic of the semiconductor memory device is abnormal. For example, when the state information is temperature information of the semiconductor memory device, the inversion determination unit 600 deactivates the inversion signal INV_EN when the temperature information falls within a preset critical range, and activates the inversion signal INV_EN when the temperature information deviates from the critical range. In the internal temperature information example, referring to FIG. 3A, the inversion determination unit 600 may include an upper limit temperature comparison section 651, a lower limit temperature comparison section 652, and a logic combination section 653. Specifically, the upper limit temperature comparison section 651 is configured to compare current temperature information TEMP_CODE outputted from a temperature information generation circuit 20 with a digital code corresponding to a preset upper limit critical temperature and determine whether the current temperature information TEMP_CODE exceeds the upper limit critical temperature or not. When the current temperature information TEMP_CODE exceeds the upper limit critical temperature, the upper limit temperature comparison section 651 outputs a high logic signal, and when the current temperature information TEMP_CODE does not exceed the upper limit critical temperature, the upper limit temperature comparison section 651 outputs a low logic signal. The lower limit temperature comparison section 652 is configured to compare the current temperature information TEMP_CODE with a digital code corresponding to a preset lower limit critical temperature and determine whether the current temperature information TEMP_CODE is less than the lower limit critical temperature or not. When the current temperature information TEMP_CODE is less than the lower limit critical temperature, the lower limit temperature comparison section 652 outputs a high logic signal, and when the current temperature information TEMP_CODE is equal to or more than the lower limit critical temperature, the lower limit temperature comparison section 652 outputs a low logic signal. The logic combination section 653 is configured to receive the output signals of the upper limit temperature comparison section 651 and the lower limit temperature comparison section 652 and determine whether or not the current temperature information TEMP_CODE falls within the critical range More specifically, the logic combination section 653 is configured to determine whether the current temperature information TEMP_CODE falls between the upper limit critical temperature and the lower limit critical temperature. When any one of the output signals of the upper limit temperature comparison section 651 and the lower limit temperature comparison section 652 is at a high logic level, the logic combination section 653 activates the inversion signal INV_EN to a high logic level. When both of the output signals of the upper limit temperature comparison section 651 and the lower limit temperature comparison section 652 are at a low logic level, the logic combination section 653 deactivates the inversion signal INV_EN to a low logic level. Here, the temperature information generation circuit 20 is a circuit that includes a band gap reference circuit and an analog-digital converter, and the temperature information generation circuit 20 is configured to output a digital code corresponding to an internal temperature of the semiconductor memory device. Since the temperature information generation circuit 20 corresponds to a circuit that is widely known to a person skilled in the art, further description of the temperature information generation circuit 20 is omitted.

Figure 3B:
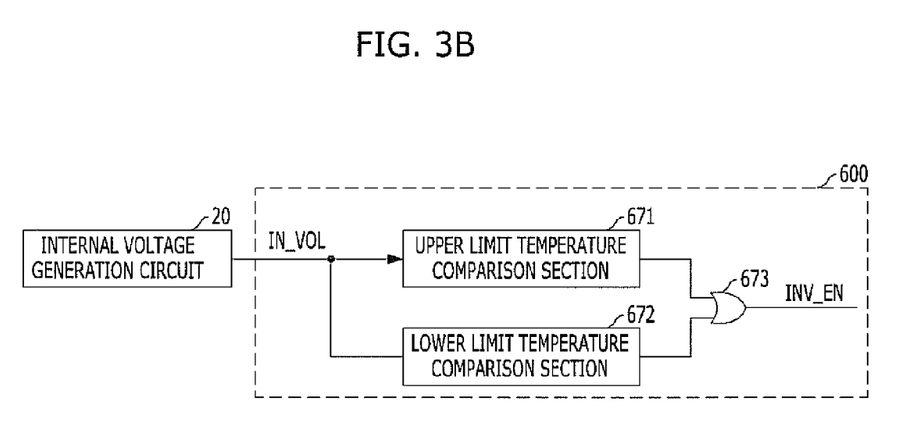
FIG. 3B illustrates a second example of an inversion determination unit of FIG. 2.

For another example, the state information may indicate the internal voltage information of the semiconductor memory device. When an internal voltage generated by using a power supply voltage applied from outside of the semiconductor memory device falls within a preset critical range, the inversion determination unit 600 deactivates the inversion signal INV_EN, and when the internal voltage deviates from the critical range, the inversion determination unit 600 activates the inversion signal INV_EN. In the internal voltage example, referring to FIG. 3B, the inversion determination unit 600 may include an upper limit voltage comparison section 671, a lower limit voltage comparison section 672, and a logic combination section 673. The upper limit voltage comparison section 671 is configured to compare an internal voltage IN_VOL generated by an internal voltage generation circuit 30 with a preset upper limit critical voltage and determine whether the level of the internal voltage IN_VOL is higher than the upper limit critical voltage or not. When the level of the internal voltage IN_VOL is higher than the upper limit critical voltage, the upper limit voltage comparison section 671 outputs a high logic signal, and when the level of the internal voltage IN_VOL is equal to or lower than the upper limit critical voltage, the upper limit voltage comparison section 671 outputs a low logic signal. The lower limit voltage comparison section 672 is configured to compare the internal voltage IN_VOL with a preset lower limit critical voltage and determine whether the level of the internal voltage IN_VOL is higher than the lower limit critical voltage or not. When the level of the internal voltage IN_VOL is lower than the upper limit critical voltage, the lower limit voltage comparison section 672 outputs a high logic signal, and when the level of the internal voltage IN_VOL is equal to or higher than the lower limit critical voltage, the lower limit voltage comparison section 672 outputs a low logic signal. The logic combination section 673 is configured to receive the output signals of the upper limit voltage comparison section 671 and the lower limit voltage comparison section 672 and determine whether or not the level of the internal voltage IN_VOL falls within a critical range, more specifically, between the upper limit critical voltage and the lower limit critical voltage. When any one of the output signals of the upper limit voltage comparison section 671 and the lower limit voltage comparison section 672 is at a high logic level, the logic combination section 673 activates the inversion signal INV_EN to a high logic level. When both of the output signals of the upper limit voltage comparison section 671 and the lower limit voltage comparison section 672 are at a low logic level, the logic combination section 673 deactivates the inversion signal INV_EN to a low logic level. Here, the internal voltage generation circuit 30 is a circuit that is configured to generate a voltage used in the semiconductor memory device. Since the internal voltage generation circuit 30 corresponds to a circuit that is widely known to a person skilled in the art, further description of the internal voltage generation circuit 30 is omitted.

For another example, the state information may indicate whether data is normally stored in the cell array area 400. When data is normally stored, the inversion determination unit 600 deactivates the inversion signal INV_EN, and when data is abnormally stored, the inversion determination unit 600 activates the inversion signal INV_EN. In this example, the inversion determination unit 600 may receive data from the cell array area 400, compare the received data, and determine whether or not to activate the inversion signal INV_EN according to whether all of the received data are identical or not. This example will be described below in detail with reference to FIG. 4.

Since the inversion determination unit 600 is used when testing the semiconductor memory device, the inversion determination unit 600 may be designed to deactivate the inversion signal INV_EN when the semiconductor memory device is in a normal mode for operating a normal operation.

The data output circuit 700 is configured to invert the serial data PRE_DATA outputted from the parallel-serial conversion circuit 500 in response to the inversion signal INV_EN outputted from the inversion determination unit 600 and output the inverted data to a data pad DQ PAD. More specifically, when the inversion signal INV_EN is activated, the data output circuit 700 inverts the serial data PRE_DATA outputted from the parallel-serial conversion circuit 500, and when the inversion signal INV_EN is deactivated, the data output circuit 700 does not invert the serial data PRE_DATA outputted from the parallel-serial conversion circuit 500 and outputs the data to the data pad DQ PAD. Specifically, the data output circuit 700 may include a data inversion unit 710 and a driver 720. The data inversion unit 710 is configured to invert the serial data PRE_DATA outputted from the parallel-serial conversion circuit 500 when the inversion signal INV_EN is activated, and the date inversion unit 710 is configured not to invert the serial data PRE_DATA when the inversion signal INV_EN is deactivated. The driver 720 is configured to output the serial data I_DATA outputted from the data inversion unit 710. For example, the serial data PRE_DATA, which is successively outputted from the parallel-serial conversion circuit 500, may be 10110011. In this example, when the inversion signal INV_EN is activated, the data inversion unit 710 outputs the inverted serial data I_DATA of 01001100 to the driver 720, and the driver 720 outputs the serial data I_DATA of 01001100 to the data pad DQ PAD. Alternatively, when the inversion signal INV_EN is deactivated, the data inversion unit 710 outputs 10110011 as the non-inverted serial data I_DATA to the driver 720, and the driver 720 outputs the serial data I_DATA of 10110011 to the data pad DQ PAD.

Figure 4:
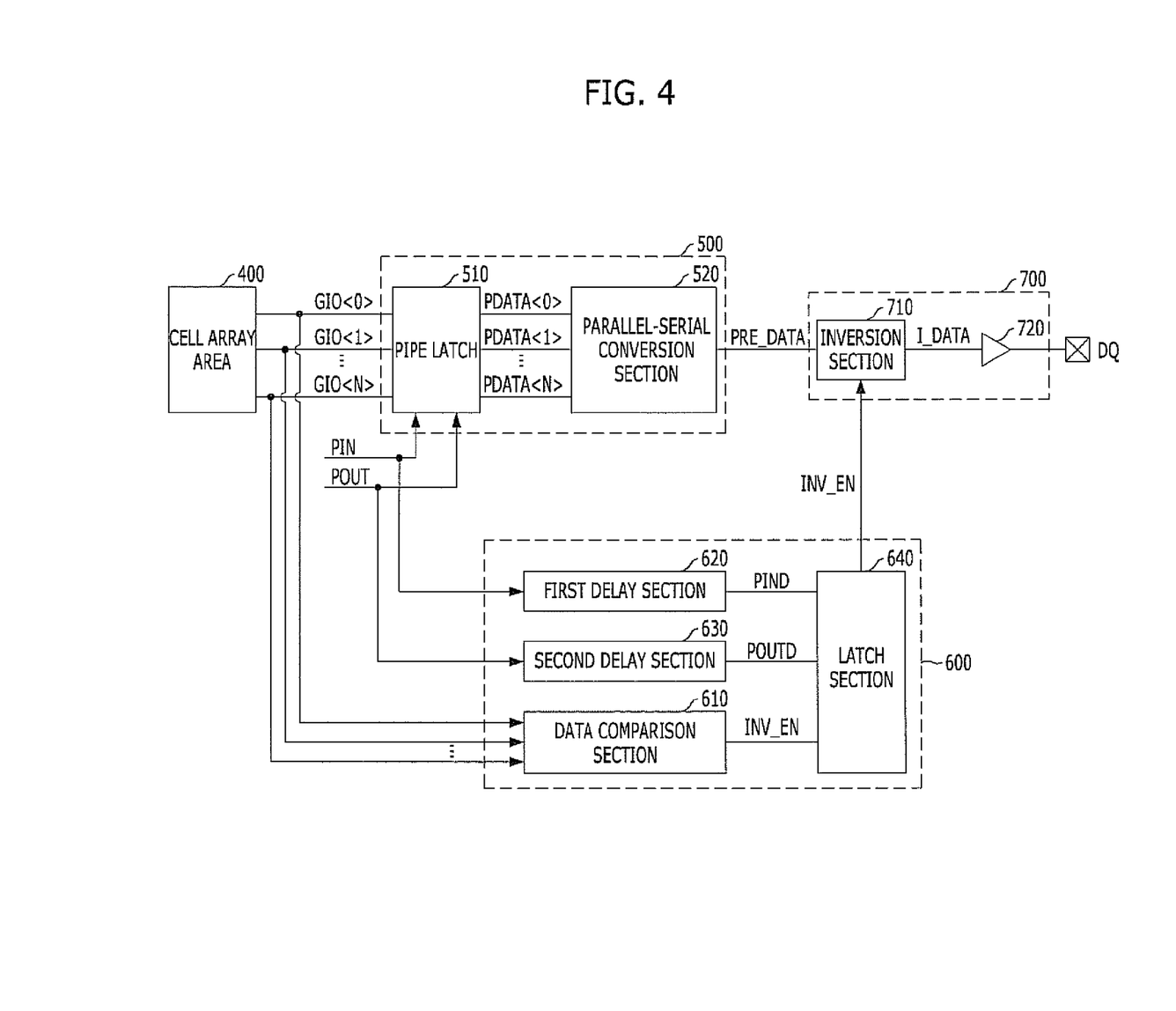
FIG. 4 illustrates a semiconductor memory device in accordance with a second embodiment of the present invention.

FIG. 4 illustrates a semiconductor memory device in accordance with a second embodiment of the present invention. The semiconductor memory device of FIG. 4 is an example of a semiconductor memory device that may be applied where state information of the semiconductor memory device indicates whether data is normally stored in a cell array area 400 or not. To test whether data is normally stored in the cell array area 400 or not, test data is stored in the cell array area 400, and the stored data is read from the cell array area 400 and compared. When all of the stored data is identical, the cell array area 400 is determined to be normal, and when any one of the stored data is different, some cells of the cell array area 400 are determined to be defective. For this operation, the inversion determination unit 600 may include a data comparison section 610, a first delay section 620, a second delay section 630, and a latch section 640.

The data comparison section 610 is configured to receive data from the plurality of data buses GIO<0:N> outputted from the cell array area 400 and compare the received data. When all of the received data is identical, the data comparison section 610 deactivates an inversion signal INV_EN, and when any one of the received data is different, the data comparison section 610 activates the inversion signal INV_EN. For example, when the data received by the data comparison section 610 is 11101111, the data comparison section 610 activates the inversion signal INV_EN to the latch section 640. More specifically, the data comparison section 610 activates the inversion signal INV_EN to a high logic level. Alternatively, when the data received by the data comparison section 610 is 11111111, the data comparison section 610 activates inversion signal INV_EN to the latch section 640. More specifically, the data comparison section 610 deactivates the inversion signal INV_EN to a low logic level.

The first delay section 620 is configured to delay a first input control signal PIN by a first delay value and generate a second input control signal PIND. The first delay value may correspond to a time for a comparison operation of the data comparison section 610. When the latch section 640 latches the inversion signal INV_EN from the data comparison section 610 in synchronization with the first input control signal PIN, the latch section 640 may latch an incorrect inversion signal INV_EN while the data comparison section 610 performs a comparison operation. Therefore, to prevent the latch section 640 from latching an incorrect inversion signal INV_EN, the first delay section 610 generates the second input control signal PIND obtained by delaying the first input control signal PIN by the time for the operation of the data comparison section 610, and the first delay section 610 outputs the generated second input control signal PIND to the latch section 640.

The second delay section 630 is configured to delay a first output control signal POUT by a second delay value and generate a second output control signal POUTD. The second delay value may correspond to a time for an operation of the parallel-serial conversion unit 520. The first output control signal POUT is delayed to adjust a timing when the serial data PRE_DATA is outputted from the parallel-serial conversion circuit 500 to a timing when the inversion signal INV_EN is outputted from the inversion determination unit 600. More specifically, the first output control signal POUT is delayed so that the inversion signal INV_EN is not outputted from the inversion determination unit 600 to the data output circuit 700 before the serial data PRE_DATA is outputted to the data output circuit 700 from the parallel-serial conversion circuit 500. When the inversion determination unit 600 outputs the inversion signal INV_EN in synchronization with the first output control signal POUT, the inversion signal INV_EN may be inputted to the data output circuit 700 before the parallel-serial conversion unit 520 convert the parallel data PDATA<0:N> into serial data PRE_DATA. If the inversion signal INV_EN is input to the data output circuit 700 before the parallel data PDATA<0:N> is converted to serial data PRE_DATA, an abnormal operation may be performed. The second delay section 630 generates the second output control signal POUTD obtained by delaying the first output control signal POUT by the time for the operation of the parallel-serial conversion unit 520 to output the inversion signal INV_EN in synchronization with the serial data PRE_DATA, and the second delay section 630 outputs the second output control signal POUTD to the latch section 640.

The latch section 640 is configured to receive and latch the inversion signal INV_EN outputted from the data comparison section 610 in synchronization with the second input control signal PIND, and output the latched inversion signal INV_EN to the data output circuit 700 in synchronization with the second output control signal POUTD. More specifically, the latch section 640 latches the inversion signal INV_EN outputted from the data comparison section 610 to output the inversion signal INV_EN to the data output circuit 700 when the parallel-serial conversion circuit 500 outputs the serial data PRE_DATA to the data output circuit 700.

Figure 5:
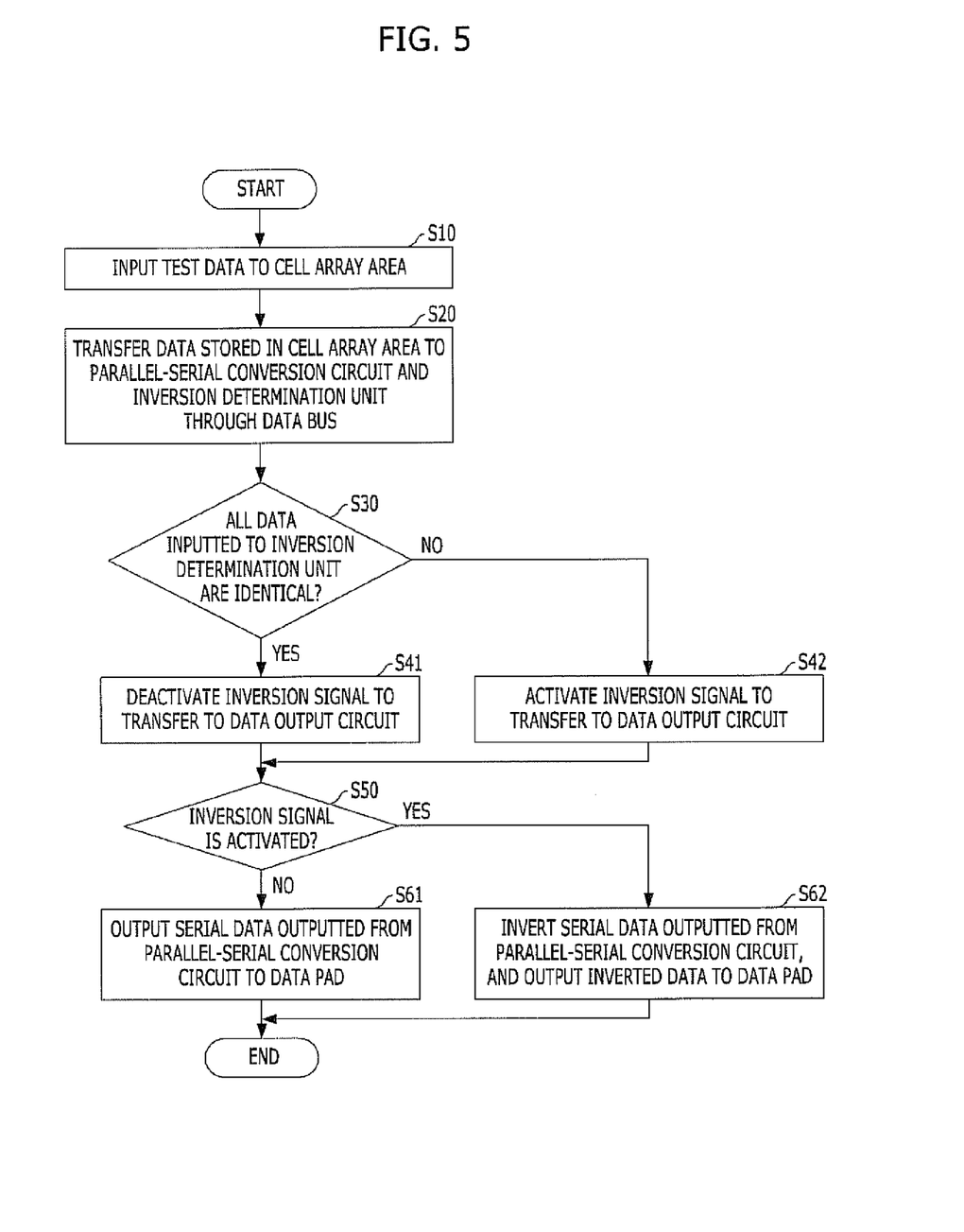
FIG. 5 is a flow charge showing the operation of the semiconductor memory device of FIG. 4.

Referring to FIG. 5, the operation of the semiconductor memory device illustrated in FIG. 4 will be described. First, test data 0 is stored in test target cells of the cell array area 400 at step S10. Data stored in the cell array area 400 is loaded into the data buses GIO<0:7>. For example, the parallel data loaded in the data buses GIO<0:7> is assumed to be 00010000. The pipe latch 510 of the parallel-serial conversion circuit 500 receives and latches the data loaded in the data buses GIO<0:7> in synchronization with the first input control signal PIN at step S20. Simultaneously, the data comparison section 610 of the inversion determination unit 600 receives the data loaded in the data buses GIO<0:7> at step S20. Next, the data comparison section 610 determines whether all of the received data is identical or not, through a comparison operation, at step S30. Since the received data of 00010000 includes one data bit that is different from the other data bits, the data comparison section 610 activates the inversion signal INV_EN to a high level at step S42. While the data comparison section 610 performs a comparison operation, the first delay section 620 of the inversion determination unit 600 delays the first input control signal PIN by an amount of time for the operation of the data comparison section 610, generates the second input control signal PIND, and outputs the generated second input control signal PIND to the latch section 640. The latch section 640 receives the activated inversion signal INV_EN from the data comparison section 610 in synchronization with a time when the second input control signal PIND is activated, and the latch section 640 latches the received signal.

The pipe latch 510 of the parallel-serial conversion circuit 500 outputs the latched parallel data PDATA<0:7> to the parallel-serial conversion unit 520 in synchronization with the first output control signal POUT. The parallel-serial conversion unit 520 converts the inputted parallel data PDATA<0:7> into serial data PRE_DATA and outputs the serial data PRE_DATA to the data output circuit 700.

Meanwhile, the second delay section 630 of the inversion determination unit 600 generates the second output control signal POUTD by delaying the first output control signal POUT by an amount of time for the operation of the parallel-serial conversion unit 520, and the second delay section 630 outputs the generated second output control signal POUTD to the latch section 640. The latch section 640 outputs the latched inversion signal INV_EN to the data output circuit 700 in synchronization with a time when the second output control signal POUTD is activated, at step S42. More specifically, the latch section 640 outputs the activated inversion signal INV_EN to the data output circuit 700 according to a time when the parallel-serial conversion unit 520 outputs the serial data PRE_DATA to the data output circuit 700. The data inversion unit 710 of the data output circuit 700 inverts the inputted serial data PRE_DATA of 00010000 in response to the activated inversion signal INV_EN, and the data inversion unit 710 outputs the inverted serial data I_DATA of 11101111 to the driver 720, at step S62. The driver 720 outputs the serial data I_DATA to the data pad DQ PAD at step S62. Since the data 11101111 outputted to the data pad DQ PAD is different from the inputted test data 00000000, some cells of the cell array area 400 may have an error, in particular, a memory cell coupled to the data bus GIO<3> may have an error. As such, the state of the semiconductor device may be recognized through the data outputted to the data pad DQ PAD without adding a test pin for outputting the state information of the semiconductor memory device. In this embodiment, whether defective cells exist or not may be recognized. In addition to the information on whether defective cells exist or not, which cell is defective may be specifically recognized. By recognizing which cell is defective through the data pin, the test time may be reduced.

In the example where the integrated circuit chip is a semiconductor memory device, the described operation of the semiconductor memory device was used for illustration purposes. However, even when the integrated circuit chip is another kind of integrated circuit chip, for example, a CPU, the overall operation principle thereof is similar to the operation described with reference to FIGS. 2 to 4. More specifically, whether or not to activate the inversion signal INV_EN is decided according to the state information of the integrated circuit chip, and data is inverted in response to the activated inversion signal INV_EN and outputted to a circuit outside of the integrated circuit chip.

Figure 6:
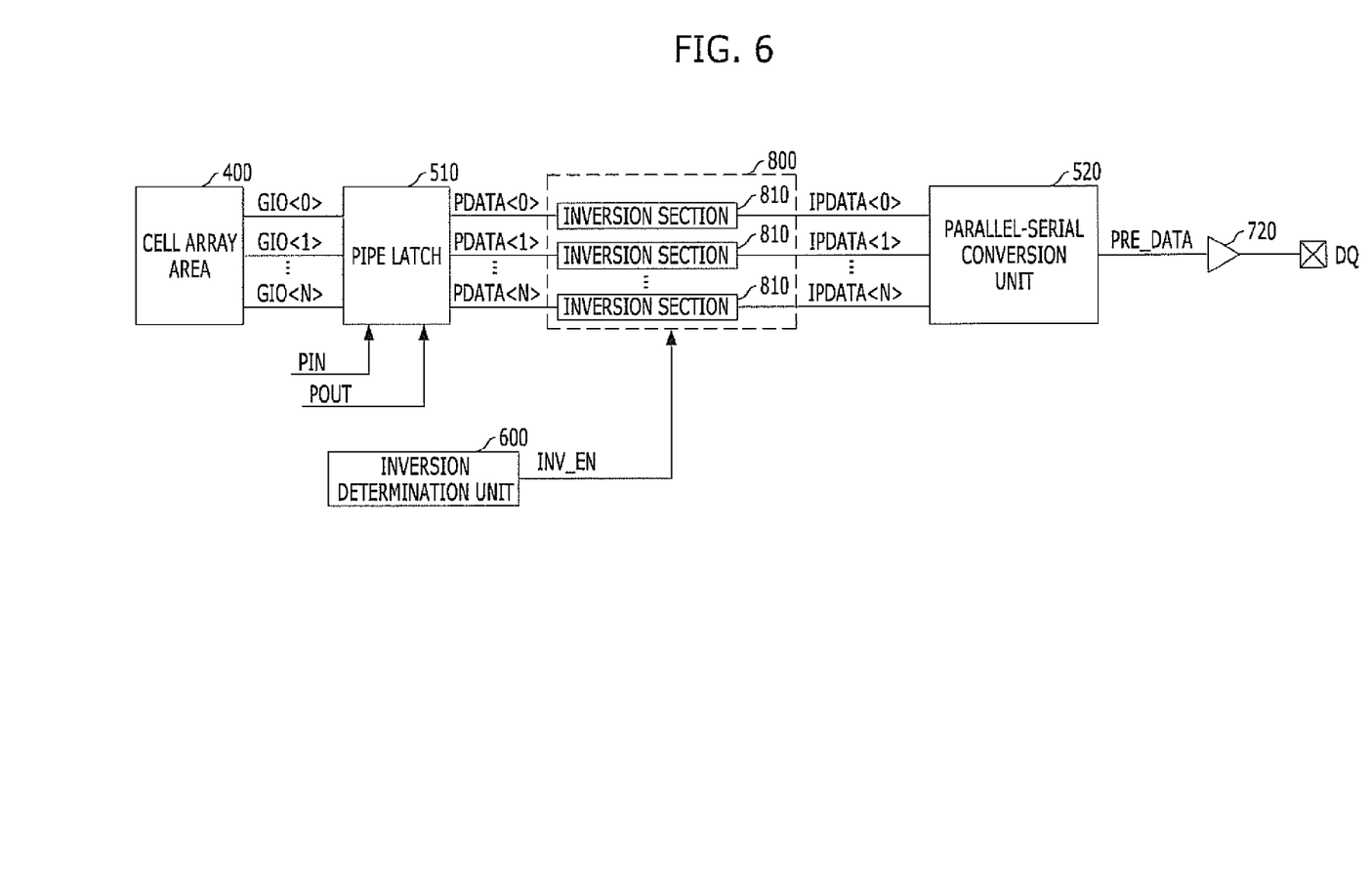
FIG. 6 illustrates a semiconductor memory device in accordance with a third embodiment of the present invention.

FIG. 6 illustrates a semiconductor memory device in accordance with a third embodiment of the present invention. The semiconductor memory devices illustrated in FIGS. 2 and 4 converts parallel data PDATA<0:N> into serial data and subsequently inverts the serial data PRE_DATA in response to the inversion signal INV_EN. However, the semiconductor memory device illustrated in FIG. 6 inverts parallel data PDATA<0:N> in response to the inversion signal INV_EN and subsequently converts the inverted data into serial data.

Specifically, the semiconductor memory device in accordance with the third embodiment of the present invention includes a cell array area 400, a plurality of data buses GIO<0:N>, a pipe latch 510, an inversion determination unit 600, and a parallel data inversion unit 800. The configurations and operations of the cell array area 400, the data buses GIO<0:N>, the pipe latch 510, and the inversion determination unit 600 are the same as the configurations and operations described with reference to FIGS. 2 and 3.

The parallel data inversion unit 800 is configured to invert the parallel data PDATA<0:N> outputted from the pipe latch 510 when the inversion signal INV_EN outputted from the inversion determination unit 600 is activated, and the parallel data inversion unit 800 is configured not to invert the parallel data PDATA<0:N> when the inversion signal INV_EN is deactivated. The parallel data inversion unit 800 may include a plurality of inversion sections 810. More specifically, the parallel data PDATA<0:N> outputted from the pipe latch 510 is inputted to respective inversion sections 810. When the inversion signal INV_EN is activated, the respective inversion sections 810 invert the parallel data PDATA<0:N>, and when the inversion signal INV_EN is deactivated, the respective inversion sections 810 do not invert the parallel data PDATA<0:N>.

Meanwhile, referring to FIG. 6, the semiconductor memory device in accordance with the third embodiment of the present invention may further include a parallel-serial conversion unit 520 and a driver 720. The configuration and operation of the parallel-serial conversion unit 520 are the same as the configuration and operation of the parallel-serial conversion unit 520 described with reference to FIG. 2, except that the parallel-serial conversion unit 520 receives parallel data IPDATA<0:N> outputted from the parallel data inversion unit 800 instead of the parallel data PDATA<0:N> outputted from the pipe latch 510.

The driver 720 outputs the serial data PRE_DATA outputted from the parallel-serial conversion unit 520 to the data pad DQ PAD.

In accordance with the embodiments of the present invention, since the state of the integrated circuit chip may be recognized without an additional test pin, the area of the chip may be reduced.

Furthermore, when testing whether data is normally stored in memory cells or not, whether memory cells are defective or not as well as the positions of defective cells may be recognized, and thus the test time may be reduced. Accordingly, productivity may be reduced.

While the present invention has been described with respect to the specific embodiments, it will be apparent to those skilled in the art that various changes and modifications may be made without departing from the spirit and scope of the invention as defined in the following claims.

The invention claimed is:

1. An integrated circuit chip comprising:
   an internal circuit configured to generate output data;
   an inversion determination unit configured to activate/deactivate an inversion signal according to state information regarding a state of the integrate circuit chip; and
   a signal output circuit configured to invert or not to invert the output data in response to the inversion signal and output the inverted or non-inverted output data,
   wherein the state information includes temperature information or operation voltage information of the integrated circuit chip.

2. The integrated circuit chip of claim 1, wherein the signal output circuit comprises:
   a signal inversion section configured to invert the output data when the inversion signal is activated and configured not to invert the output data when the inversion signal is deactivated; and
   a driver configured to output the data outputted from the signal inversion section.

3. The integrated circuit chip of claim 1, wherein the inversion determination unit activates the inversion signal when the temperature information is outside a critical range, and deactivates the inversion signal when the temperature information is within the critical range.

4. The integrated circuit chip of claim 1, wherein the inversion determination unit activates the inversion signal when the operation voltage information is outside a critical range, and deactivates the inversion signal when the voltage information is within the critical range.

5. The integrated circuit chip of claim 1, wherein, in a normal mode, the inversion determination unit maintains the inversion signal in a deactivation state, and
   in a test mode, the inversion determination unit activates/deactivates the inversion signal according to the state information.

6. A semiconductor memory device comprising:
   a cell array area;
   a plurality of data buses configured to transmit a plurality of data bits outputted from the cell array area;
   a parallel-serial conversion circuit configured to convert parallel data loaded in the plurality of data buses into serial data;
   an inversion determination unit configured to activate/deactivate an inversion signal according to state information regarding a state of the semiconductor memory device; and
   a data output circuit configured to invert the serial data outputted from the parallel-serial conversion circuit in response to the inversion signal and output the inverted data to a data pad,
   wherein the state information includes temperature information or operation voltage information of the semiconductor memory device.

7. The semiconductor memory device of claim 6, wherein the parallel-serial conversion circuit comprises:
   a pipe latch configured to latch the parallel data loaded in the plurality of data buses in synchronization with a first input control signal and output the latched data in synchronization with a first output control signal; and
   a parallel-serial conversion unit configured to convert the parallel data outputted from the pipe latch into serial data.

8. The semiconductor memory device of claim 6, wherein the inversion determination unit activates the inversion signal when the temperature information is outside a critical range, and deactivates the inversion signal when the temperature information is within the critical range.

9. The semiconductor memory device of claim 6, wherein the inversion determination unit activates the inversion signal when the operation voltage information deviates is outside a critical range, and deactivates the inversion signal when the voltage information is within the critical range.

10. The semiconductor memory device of claim 6, wherein, in a normal mode, the inversion determination unit maintains the inversion signal in a deactivation state, and
    in a test mode, the inversion determination unit activates/deactivates the inversion signal according to the state information.

11. The semiconductor memory device of claim 6, wherein the data output circuit comprises:
    a data inversion unit configured to invert the serial data outputted from the parallel-serial conversion circuit when the inversion signal is activated, and configured not to invert the serial data when the inversion signal is deactivated; and
    a driver configured to output the data outputted from the data inversion unit to the data pad.

12. A semiconductor memory device comprising:
    a cell array area;
    a plurality of data buses configured to transmit a plurality of data bits outputted from the cell array area;
    a pipe latch configured to latch parallel data loaded in the plurality of data buses and output parallel data;
    an inversion determination unit configured to activate/deactivate an inversion signal according to state information regarding the state of the semiconductor memory device; and
    a parallel data inversion unit configured to invert the parallel data outputted from the pipe latch when the inversion signal is activated, and configured not to invert the parallel data outputted from the pipe latch when the inversion signal is deactivated,
    wherein the state information includes temperature information or operation voltage information of the semiconductor memory device.

13. The semiconductor memory device of claim 12, further comprising:
    a parallel-serial conversion unit configured to convert the parallel data outputted from the parallel data inversion unit into serial data; and
    a driver configured to output the serial data outputted from the parallel-serial conversion unit to the data pad.

14. A method for testing a semiconductor memory device, comprising:
    inputting data to a cell array area;
    reading a plurality of data bits stored in the cell array area and loading the read data into a plurality of data buses;
    converting parallel data loaded in the plurality of data buses into serial data;
    activating/deactivating an inversion signal according to state information regarding the state of the semiconductor memory device;
    inverting/non-inverting the serial data in response to the inversion signal; and
    outputting the inverted/non-inverted data to a data pad,
    wherein the state information includes temperature information or operation voltage information of the semiconductor memory device.

* * * * *